United States Patent
Levy et al.

(10) Patent No.: US 9,871,622 B2
(45) Date of Patent: Jan. 16, 2018

(54) METHOD FOR INCREASING THE PROBABILITY OF ERROR CORRECTION IN AN OPTICAL COMMUNICATION CHANNEL

(71) Applicant: MULTIPHY LTD., Ness Ziona (IL)

(72) Inventors: Omri Levy, Tel Aviv (IL); Udi Barzilai, Meitar (IL)

(73) Assignee: Multiphy Ltd., Ness Ziona (IL)

( * ) Notice: Subject to any disclaimer, the term of this patent is extended or adjusted under 35 U.S.C. 154(b) by 0 days.

(21) Appl. No.: 14/662,593

(22) Filed: Mar. 19, 2015

(65) Prior Publication Data

US 2015/0270928 A1 Sep. 24, 2015

Related U.S. Application Data

(60) Provisional application No. 61/955,820, filed on Mar. 20, 2014.

(51) Int. Cl.
| | | |
|---|---|---|
| *H04L 1/00* | (2006.01) | |
| *H04J 14/08* | (2006.01) | |
| *H04B 10/27* | (2013.01) | |
| *H03M 13/00* | (2006.01) | |
| *H04L 25/03* | (2006.01) | |
| *H04L 25/14* | (2006.01) | |
| *H03M 13/15* | (2006.01) | |
| *H03M 13/27* | (2006.01) | |

(52) U.S. Cl.
CPC ...... *H04L 1/0042* (2013.01); *H03M 13/1515* (2013.01); *H03M 13/27* (2013.01); *H04B 10/27* (2013.01); *H04L 1/0041* (2013.01); *H04L 1/0071* (2013.01); *H04L 25/14* (2013.01); *H04L 25/03057* (2013.01)

(58) Field of Classification Search
None
See application file for complete search history.

(56) References Cited

U.S. PATENT DOCUMENTS

| | | | | |
|---|---|---|---|---|
| 8,259,733 | B2* | 9/2012 | Conklin | H04J 3/1652 370/395.51 |
| 8,473,820 | B2* | 6/2013 | Shin | H03M 13/251 714/776 |
| 8,768,181 | B2* | 7/2014 | Onohara | H04B 10/40 398/136 |
| 2007/0047667 | A1* | 3/2007 | Shumarayev | H04L 25/14 375/295 |
| 2010/0272438 | A1* | 10/2010 | Conklin | H04J 3/1652 398/58 |
| 2010/0281343 | A1* | 11/2010 | Caggioni | H03M 13/05 714/776 |
| 2011/0083051 | A1* | 4/2011 | Chin | H03M 13/271 714/752 |

(Continued)

Primary Examiner — Justin R Knapp
(74) Attorney, Agent, or Firm — Fenwick & West LLP

(57) ABSTRACT

A method for improving the resilience of a communication channel (such as an optical communication channel) to correlated errors (e.g., burst errors), the channel is being formed by a time-multiplexed aggregation of a plurality of lower rate constituent lanes and employs a Forward Error-Correction (FEC) mechanism for forming codewords from data carried by the constituent lanes. Accordingly, the distribution of errors among the codewords is modified by introducing, at the transmitter side, specific delays to the transmission times via the constituent lanes, relative to each other.

10 Claims, 4 Drawing Sheets

(56) References Cited

U.S. PATENT DOCUMENTS

| | | | |
|---|---|---|---|
| 2012/0288277 A1* | 11/2012 | Shin | H04L 25/14 |
| | | | 398/45 |
| 2015/0206561 A1* | 7/2015 | Brewer | G06F 12/04 |
| | | | 711/105 |
| 2016/0056886 A1* | 2/2016 | Kitamura | H04J 3/1652 |
| | | | 398/5 |

* cited by examiner

METHOD FOR INCREASING THE PROBABILITY OF ERROR CORRECTION IN AN OPTICAL COMMUNICATION CHANNEL

FIELD OF THE INVENTION

The present invention relates to the field of data communication over high speed optical communication channels. More particularly, the invention relates to a method for improving the resilience of a communication channel to correlated errors by interleaving at the transmission end.

BACKGROUND OF THE INVENTION

High rate transmission (e.g., 112 Gbps) of data serially over one physical communication channel (link) may be difficult to implement. In order to allow the transmission over high data rate communication links, current transmission standards define the use of Multi Lane Distribution (MLD), according to which the data is distributed and transmitted over several virtual lanes, each of which is sent over a physical layer at a lower data rate. The MLD provides flexibility in the implementation of physical layer lanes.

A Forward Error Correction (FEC) mechanism is normally used at the receiver side, in order to accurately reconstruct the transmitted data. The FEC enables relaxing SNR (and BER) requirements from the physical layer link.

As an example of FEC mechanism, the standard "Generic Forward Error Correction" GFEC is a Reed-Solomon coding (a non-binary cyclic error-correcting code) that allows certain amount of errors to be acceptable in the physical layer lanes, thus, a transmission with low Signal to Noise Ratio (SNR) is enabled.

The Optical Transport Lane OTL4.4 MLD (G.709) standard defines the method to map Optical Transport Unit 4 (OTU4) over 4 optical lanes. The basic Optical Transport Network (OTN—refers to networks using the ITU-T Recommendation G.709 "Interfaces for the Optical Transport Network (OTN)" describes a means of communicating data over an optical network standard for Wavelength Division Multiplexed signals) frame structure (that includes FEC) remains unchanged and frames are serialized into a stream of blocks. These blocks are then distributed in a round-robin manner (an arrangement of choosing all elements in a group equally in some specified order, usually from the top to the bottom of a list and then starting again at the top of the list and so on) over 20 virtual lanes (VLs). The VLs are usually transmitted over 4 optical lanes (each optical lane incorporates 5 VLs). At the receiver side, the VLs are recovered, reordered and de-skewed in order to recreate the OTN frame. Thus, any lane skew generated in the physical layer is compensated.

GFEC, standard Reed Salomon 239/255, fails to correct codewords and displays post FEC errors in case more than 8 bytes in a 255 byte codeword contain errors. In case link errors are not uniformly distributed, i.e. there are correlated consecutive errors, some codewords contain significantly more errors than others, and the probability for post FEC errors is increased. This is the case when using both GFEC and OTL4.4 MLD. FIG. 1 (prior art) illustrates the structure of an OTN frame, according to the G.709 standard. Logically, each OTN frame consists of 4 rows of 4080 bytes each. Since the bytes cannot be transmitted serially (due to the very high data rate), the standard suggests using MLD.

FIG. 2 (prior art) illustrates the implementation of data transmission using 20 virtual lanes, where the byte-stream of a frame is divided into 16-byte (128 bit) segments. The physical layer is divided into 4 physical lanes, where each physical lane is used to carry 5 VLs. The segments are distributed round-robin to 20 VLs. There are 255 segments in each row and 1020 segments in each frame. This allows the physical layer to operate at much lower data rate (in this example, 28 Gbps). In this case, the physical layer transmits one bit from each VL with interleaving (a process for arranging the data in a noncontiguous manner).

However, using the G.709 transmission standard creates a problem of interaction between the Multi Lane Distribution (MLD) and the Generic Forward Error Correction (GFEC) mechanism at the receiver side. This interaction leads to degradation in the channel's performance, when the reception errors induces by the channel's distortion are correlated errors (i.e., that appear in bursts, rather than being uniformly spread). In this case, the ability of the GFEC is limited, and the channel becomes much more vulnerable.

Some solutions to this interaction problem use nonstandard error correction mechanisms which eliminate this interaction, but this requires proprietary, nonstandard transmission format, requiring full control of both the transmitting and receiving sides. The GFEC can correct only up to 8 bytes erroneous in a codeword (is a certain binary sequence from a dictionary of allowable words. After transmission over a noisy channel, it is possible to check if the received binary sequence is in the dictionary of codewords and if not, choose the codeword that is most similar to what was received). When a byte in a codeword contains an error in one bit (or more), the entire byte is considered erroneous by the GFEC mechanism. Even if there are 8 erroneous bits in the same byte, still the GFEC mechanism can correct it. However, in case when the 8 erroneous bits are distributed among different bytes, the GFEC mechanism will not be able to correct the errors.

FIG. 3 (prior art) illustrates the distribution of VLs within an OTN frame, according to the G.709 transmission standard. In this example, the first bit transmitted over the channel will be mapped to the first byte of VL0 (red rectangle), the second bit over the channel will be mapped to the first byte of VL1 (red rectangle) and so forth. It can be seen that even though these bits were transmitted over the channel in a consecutive manner, in the OTN frame at the receiver they will be spaced apart by an entire segment. Here, the first byte of each segment has been mapped into the same codeword of the GFEC mechanism.

FIG. 4a (prior art) illustrates the ordering of the VLs with a burst of 5 consecutive erroneous bytes (correlative errors which are marked as black rectangles) which were mapped as the second byte in each segment.

FIG. 4b (prior art) illustrates the ordering of the GFEC codeword with mapping of this burst of 5 consecutive erroneous bytes (marked as black rectangles) into the same FEC codeword. Here, a single line side lane of 28 Gbps contains 5 VLs. The VLs are ordered in rows by lane segments of 16 bytes each. The GFEC codeword is made of one byte of each segment. Hence, each GEFC codeword contains one byte from each VL. Thus, in case there are adjacent errors in the 28 Gbps line side they are expected to be mapped into different bytes of the same codeword. When using GFEC over OTL4.4 MLD, adjacent errors generated in the line side will be mapped into different bytes of one GFEC codeword, thereby causing a higher probability for post FEC errors. It can be seen that due to the interaction between the MLD and the GFEC mechanism at the receiver side, all 5 erroneous bytes were mapped to the same codeword (Codeword 1 in this example) of the GFEC mechanism. This concentration of erroneous bytes in the same codeword eliminates the capability of the GFEC mechanism to correct them.

It is therefore an object of the present invention to provide a method for increasing the probability of error correction in an optical communication channel, which complies with the G.709 transmission standard.

It is another object of the present invention to provide a method for increasing the probability of error correction in an optical communication channel, which reduces vulnerability of the optical communication channel to noise and correlated errors.

Other objects and advantages of the invention will become apparent as the description proceeds.

SUMMARY OF THE INVENTION

The present invention is directed to a method for improving the resilience of a communication channel (such as an optical communication channel) to correlated errors (e.g., burst errors), the channel is being formed by a time-multiplexed aggregation of a plurality of lower rate constituent lanes and employs a Forward Error-Correction (FEC) mechanism for forming codewords from data carried by the constituent lanes. Accordingly, the distribution of errors among the codewords is modified by introducing, at the transmitter side, specific delays to the transmission times via the constituent lanes, relative to each other.

The original (unmodified) error distribution in the communication channel contains bursts or correlated errors caused by reducing the bandwidth of the communication channel or employing a detection scheme at the receiver side (such as Decision Feedback Equalization) that generates correlated or burst errors, such as Decision Feedback Equalization, or both.

The communication channel may employ "OTLk.n" signaling using Multi Lane Distribution (MLD), according to ITU-T Recommendation G.709 (Annex C). The OTN communication channel may employ the "Generic Forward Error Correction" (GFEC) mechanism, according to ITU-T Recommendation G.975.

The constituent virtual lanes of a single physical lane may be delayed relative to each other by an amount of time corresponding to the transmission of any value between one and fifteen bytes (octets).

The bandwidth of the communication channel may be reduced for Optical DuoBinary (ODB) modulation applications.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention suggests a method for improving the resilience of a communication channel to correlated errors. The channel is formed by a time-multiplexed aggregation of a plurality of lower rate constituent (virtual) lanes and employs a Forward Error-Correction (FEC) mechanism, for forming codewords from data carried by these constituent lanes. According to the proposed method, specific delays to the transmission times via the constituent lanes are introduced at the transmitter side, relative to each other, thereby modifying the distribution of channel error bursts in an optical communication channel which complies with the G.709 transmission standard, in order to eliminate the interaction between the Multi Lane Distribution (MLD) and the Generic Forward Error Correction (GFEC) mechanism at the receiver side. This method increases the probability of error correction in an optical communication channel and reduces vulnerability of the optical communication channel to noise and correlated errors and still complies with the G.709 transmission standard.

The original (unmodified) error distribution in the communication channel contains bursts or correlated errors. These errors are normally caused by as a result of reducing the bandwidth of the communication channel (e.g., for Optical DuoBinary (ODB) modulation applications) and/or of employing a detection scheme at the receiver side that generates correlated or burst errors, such as Decision Feedback Equalization.

The solution proposed by the present invention actually modifies the distribution of channel error bursts, such that it will still be possible to correct the induced errors using a standard GFEC mechanism, and without requiring a substantial change in the optical communication channel. The MLD part remains unchanged, since it is a part of the G.709 transmission standard (and therefore, cannot be changed).

According to the solution proposed by the present invention, a skew that is generated between the 20 VLs, before they are being distributed over the physical line side lanes. By doing so, the error generated by the line will be mapped into different codewords of the GEFC mechanism. Thus, the probability of one codeword to contain more than 8 bytes with errors is reduced.

Figure 1:
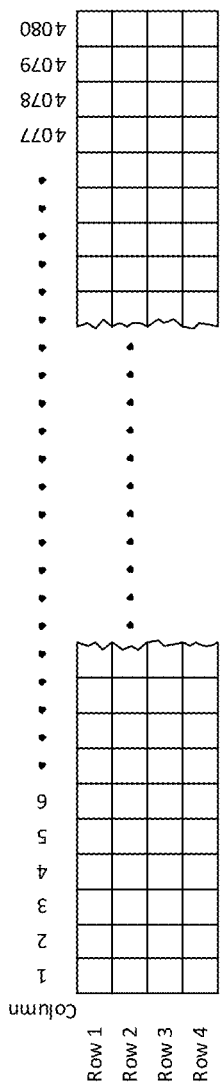
FIG. 1 (prior art) illustrates the structure of an OTN frame, according to the G.709 standard.
Figure 3:
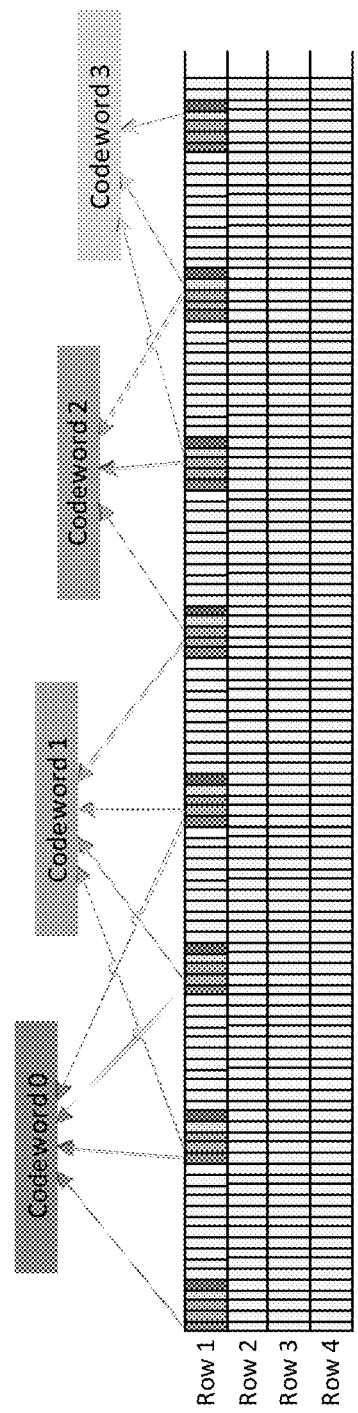
FIG. 3 (prior art) illustrates the distribution of VLs within an OTN frame, according to the G.709 transmission standard.
Figure 2:
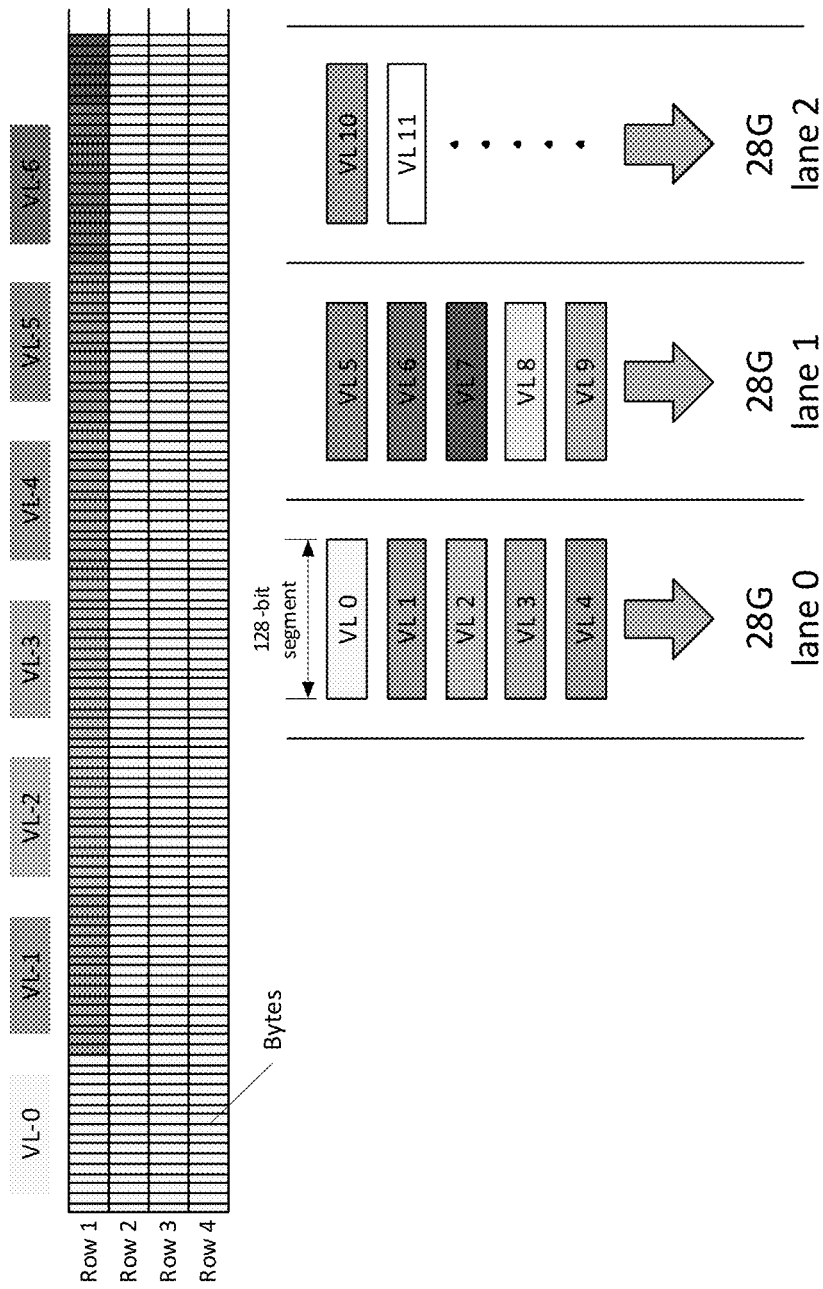
FIG. 2 (prior art) illustrates the implementation of data transmission using 20 virtual lanes (OTL 4.4 MLD), where the byte-stream of a frame is divided into 16-byte (128 bit) segments.
Figure 4A:
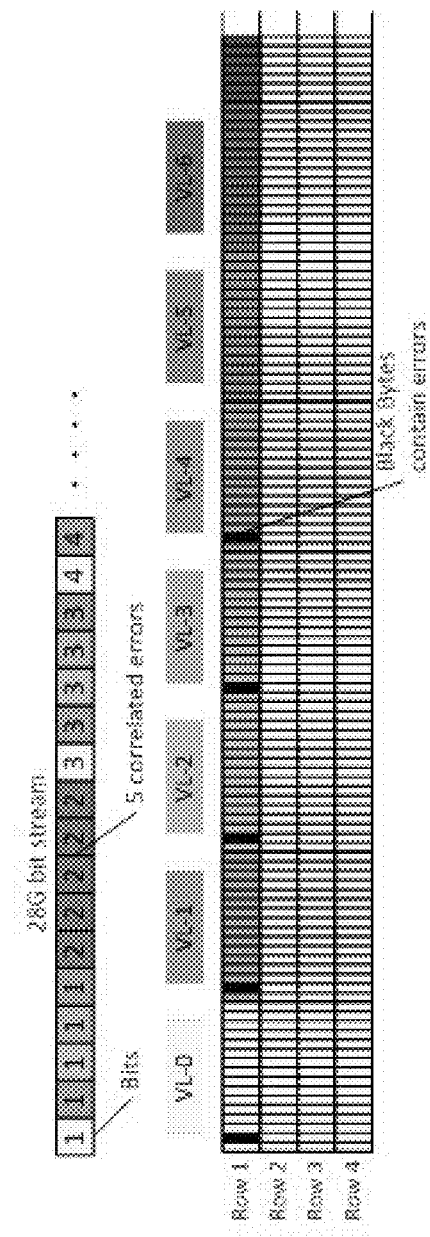
FIG. 4*a* (prior art) illustrates the ordering of the VLs with a burst of 5 consecutive erroneous bytes.
Figure 4B:
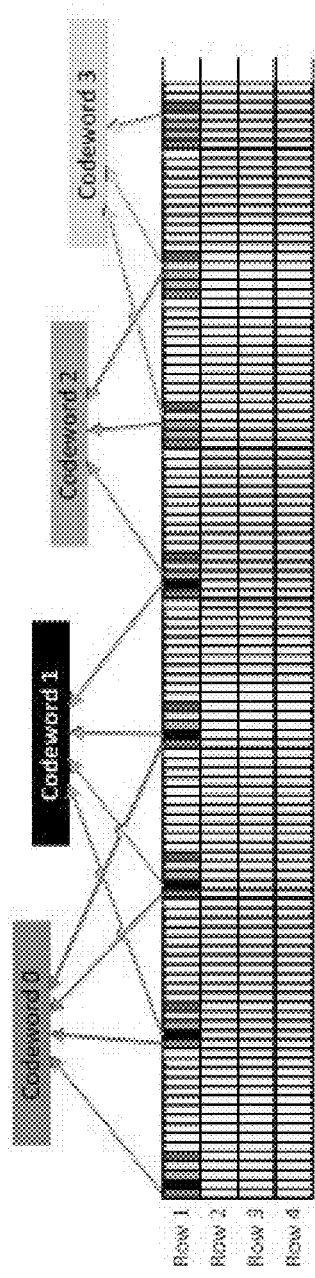
FIG. 4*b* (prior art) illustrates the ordering of the GFEC codeword with mapping of this burst of 5 consecutive erroneous bytes into the same FEC codeword.
Figure 5A:
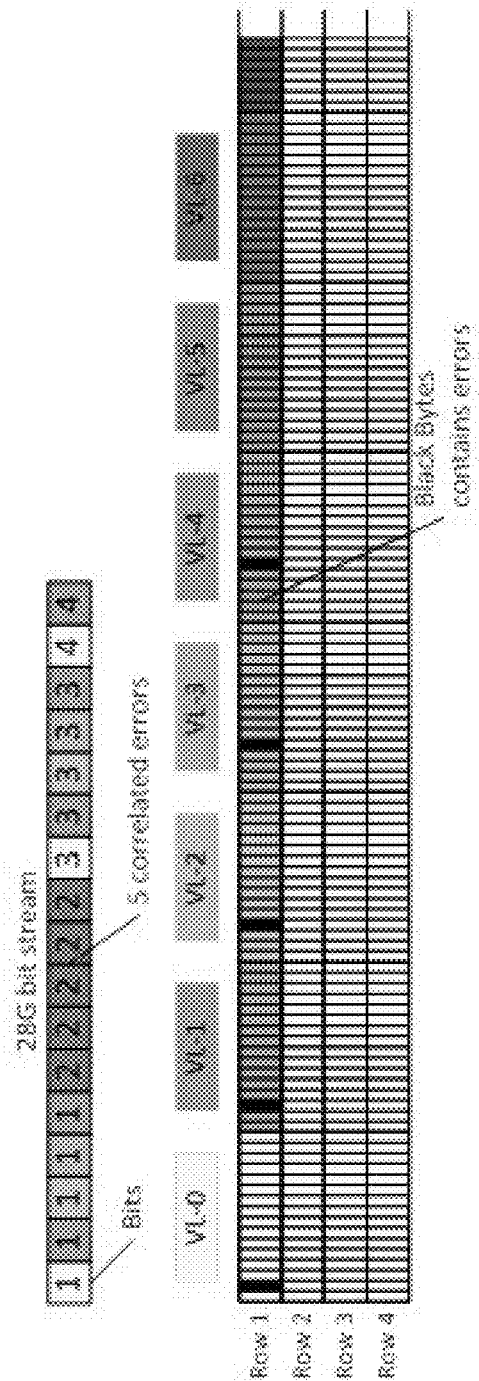
FIG. 5*a* illustrates the ordering of the VLs with a burst of 5 consecutive erroneous bytes after modifying the distribution of channel error bursts, according to the present invention.

FIG. 5*a* illustrates the ordering of the VLs with a burst of 5 consecutive erroneous bytes (5 correlative errors which are marked as black rectangles) after modifying the distribution of channel error bursts, according to the present invention. In this example, at the transmitter side, each VL is skewed (delayed) with respect to its adjacent VLs by 1 byte before being transmitted. Hence, VL1 is delayed with respect to VL0 by one byte, VL2 is delayed with respect to VL0 by 2 bytes, VL3 is delayed with respect to VL0 by 3 bytes, VL3 is delayed with respect to VL0 by 4 bytes. It can be seen that the 5 correlated errors (black rectangles) do not appear at the same location in each segment. As a result, the consecutive erroneous bytes are mapped to a different byte in each segment (that corresponds to a VL) and therefore, adjacent errors from the line side, are mapped into different GFEC codewords. The constituent virtual lanes of a single physical lane can be delayed relative to each other by an amount of time corresponding to the transmission of any value between one and fifteen bytes (octets).

Figure 5B:
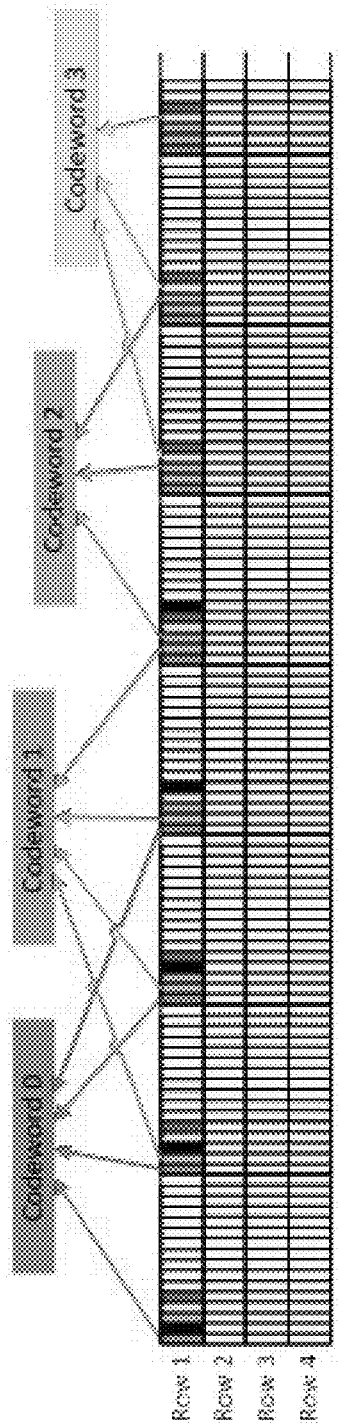
FIG. 5*b* illustrates the ordering of the GFEC codeword after modifying the distribution of channel error bursts, according to the present invention, with mapping of the burst of 5 consecutive erroneous bytes into different codewords.

FIG. 5b illustrates the ordering of the GFEC codeword after modifying the distribution of channel error bursts, with mapping of this burst of 5 consecutive erroneous bytes (marked as black rectangles) into codewords, according to the present invention. In FIG. 5b, the sequence of codewords is identical for all segments (i.e., red-grey-pink-green-brown, which correspond to Codeword 0, Codeword 1, Codeword 2, Codeword 3 and Codeword 4, respectively). As a result of modifying the distribution of channel error bursts, in each segment, an erroneous byte (black rectangle) masks one of the bytes in the following segment, but not the same byte like in prior art methods (i.e., at a different byte index at following segments). In this example, Codeword 0 will contain no erroneous bytes, Codeword 1 will contain one erroneous byte (from the $1^{st}$ segment), Codeword 2 will contain one erroneous byte (from the $2^{nd}$ segment), Codeword 3 will contain one erroneous byte (from the $3^{rd}$ segment) and Codeword 4 will contain one erroneous byte (from the $4^{th}$ segment). Therefore, the erroneous byte in each segment will be mapped to a different codeword (rather than to the same codeword). This distribution restricts the number of erroneous bytes in each codeword and allows the standard GFEC mechanism to correct the errors.

The above examples and description have of course been provided only for the purpose of illustration, and are not intended to limit the invention in any way. As will be appreciated by the skilled person, the invention can be carried out in a great variety of ways, employing more than one technique from those described above, other than used in the description, all without exceeding the scope of the invention.

The invention claimed is:

1. A method for improving resilience of a communication channel being adapted to transfer data from a transmitter side to a receiver side and having a bandwidth, to correlated errors, said channel is being formed by a time-multiplexed aggregation of a plurality of lower rate constituent virtual lanes (VLs) that are distributed over a plurality of physical layer lanes, said physical layer lanes being divisions of said communication channel, said method comprising:
  a) providing a Forward Error-Correction (FEC) mechanism at the receiver side, for reconstructing codewords from data carried by said physical layer lanes, to said receiver side, said FEC allowing a certain amount of errors to be acceptable in the physical layer lanes;
  b) introducing, at said transmitter side, a specific delay to transmission times of each of said constituent VLs, the delays relative to each other, such that the transmission time of each constituent VL is delayed with respect to the transmission time of its preceding constituent VLs by said specific delay; and
  c) distributing said constituent VLs over the physical layer lanes, thereby causing bits that are adjacent in said physical layer lanes to be recognized at the receiver side as originating from different bytes in each constituent VL, thereby distributing, by the FEC, said adjacent bits to different codewords.

2. The method according to claim 1, wherein an original unmodified error distribution in the communication channel contains bursts or correlated errors caused by one or more of the following:
  a) reducing the bandwidth of the communication channel;
  b) employing a detection scheme at the receiver side, that generates correlated or burst errors.

3. The method according to claim 2, wherein the detection scheme at the receiver side is a Decision Feedback Equalization.

4. The method according to claim 1, wherein the communication channel employs "OTLk.n" signaling using Multi Lane Distribution (MLD), according to ITU-T Recommendation G.709.

5. The method according to claim 4, wherein the communication channel is an OTN communication channel which employs a "Generic Forward Error Correction" (GFEC) mechanism, according to ITU-T Recommendation G.975.

6. The method according to claim 5, wherein the lower rate constituent virtual lanes distributed over a single physical lane are delayed relative to each other by an amount of time corresponding to transmission of any value being between one and fifteen bytes.

7. The method according to claim 1, wherein the correlated errors are burst errors.

8. The method according to claim 1, wherein the communication channel is an optical communication channel.

9. The method according to claim 1, wherein the bandwidth of the communication channel is reduced for Optical DuoBinary (ODB) modulation applications.

10. The method according to claim 1, wherein a detection scheme at the receiver side is a Decision Feedback Equalization.

* * * * *